(12) United States Patent
Gerlovin et al.

(10) Patent No.: US 7,013,246 B1
(45) Date of Patent: *Mar. 14, 2006

(54) PARAMETRIC EXCHANGE OF DATA BETWEEN A MODELING SYSTEM AND AN EXTERNAL APPLICATION PROGRAM

(75) Inventors: Emmanuel Gerlovin, Wayland, MA (US); Dmitriy Shkolnik, Andover, MA (US); Jose A. Cro Granito, Stoneham, MA (US)

(73) Assignee: Parametric Technology Corporation, Casadaga, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/318,105

(22) Filed: May 24, 1999

(51) Int. Cl.
*G06F 17/50* (2006.01)

(52) U.S. Cl. .................... 703/1; 345/419; 345/420; 700/97; 703/6

(58) Field of Classification Search ............ 703/1, 703/2, 6; 345/420, 419; 700/97
See application file for complete search history.

(56) References Cited

U.S. PATENT DOCUMENTS

| 4,989,166 A * | 1/1991 | Akasaka et al. ............ 700/197 |
| 5,182,797 A * | 1/1993 | Liang et al. ................ 345/503 |
| 6,212,441 B1 * | 4/2001 | Hazama et al. ............. 345/420 |
| 6,392,645 B1 * | 5/2002 | Han et al. .................. 345/420 |
| 6,434,441 B1 * | 8/2002 | Beauchamp et al. ........ 345/419 |

FOREIGN PATENT DOCUMENTS

| EP | 0 350 578 | 1/1990 |
| EP | 0 425 172 | 5/1991 |
| WO | WO 99/44107 | 9/1999 |

OTHER PUBLICATIONS

Cottrell et al., "CHDStd—A Model for Deep Submicron Design Tools", Design Automation Conference 1998, Proceedings of the ASP-DAC 1998, Asia and South Pacific, pp. 249-255.*
Fane "Your Table is Waiting . . . ", CADalyst, Jan. 1999, pp. 70-75.*
Deitz, "Design Optimization", Mechanical Engineering, Oct. 1998, vol. 120, Issue 10, p. 24.*
Deitz, "CAD and FEA Models Converge", Mechanical Engineering, Feb. 1997, vol. 119, Issue 2, p. 20.*
Gladwin et al., "Introduction to ProcessModel and ProcessModel 9000", Proceedings of the 1997 Winter Simulation Conference, Dec. 1997, pp. 594-600.*

* cited by examiner

*Primary Examiner*—Kamini Shah
*Assistant Examiner*—Herng-der Day
(74) *Attorney, Agent, or Firm*—Lahive & Cockfield, LLP

(57) ABSTRACT

A facility enables an external application program (EAP) to exchange data with a modeling program, such as a computer-aided design (CAD) program. The data may be parametric data used in parametric models of geometric objects in the CAD program. In one embodiment, the EAP registers with the CAD program to indicate that the EAP provides output data to the CAD program for use within a model. When the CAD program needs to reevaluate a model due to changes, the CAD program calls a callback that results from the registration of the EAP with the CAD program. The callback sends new input data to the EAP, causes the EAP to recalculate the output data and pass the new output data to the CAD program. The CAD program then integrates the new output data into the model so as to fully update the model.

19 Claims, 8 Drawing Sheets

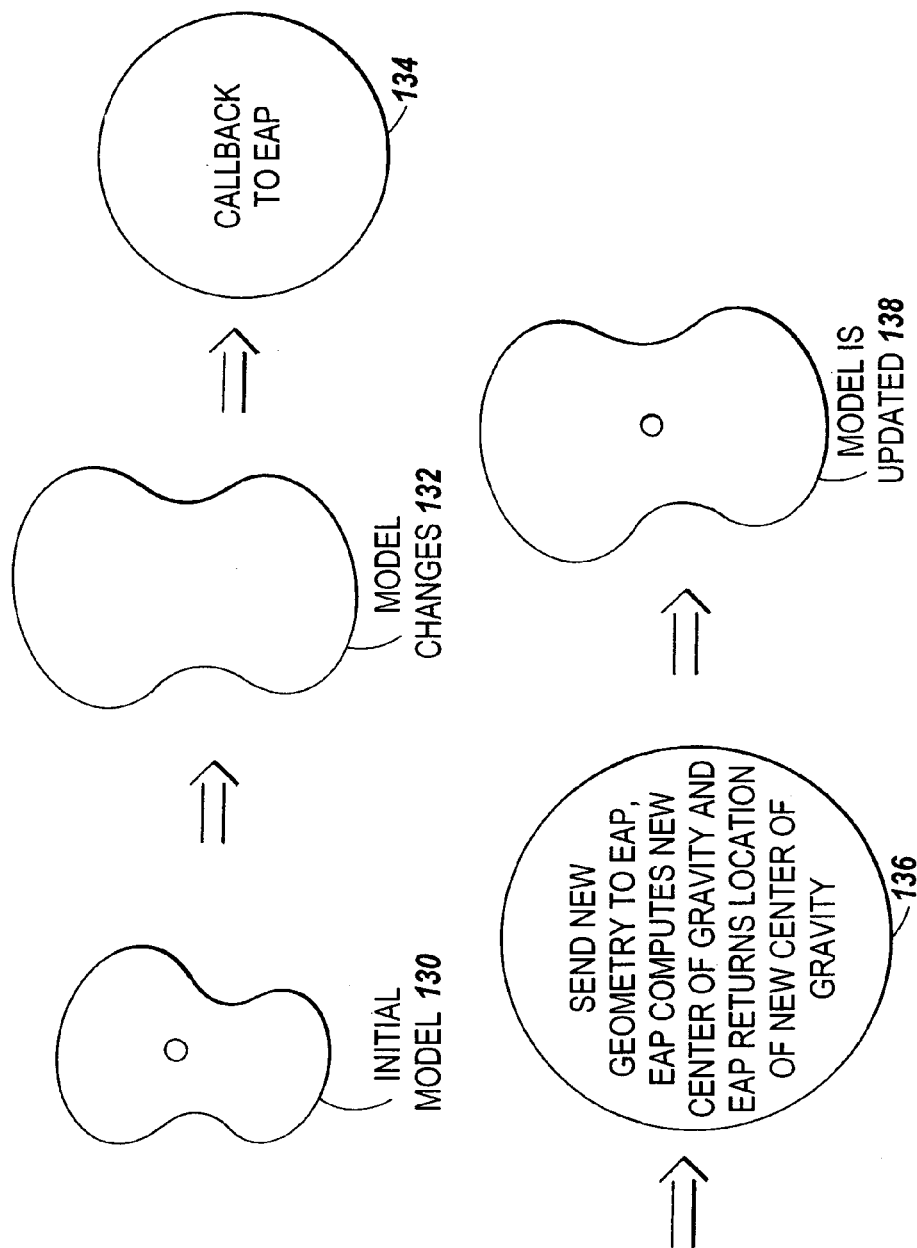

PARAMETRIC EXCHANGE OF DATA BETWEEN A MODELING SYSTEM AND AN EXTERNAL APPLICATION PROGRAM

TECHNICAL FIELD

The present invention relates generally to computer systems and more particularly to data exchange between a modeling system and an external application program.

BACKGROUND OF THE INVENTION

A computer-aided design (CAD) refers to the use of computers to assist in the design of a product. The designer uses the CAD system to create a model of the product that incorporates critical characteristics of the product. These critical characteristics may include the geometric configuration of the product as well as additional properties and attributes of the product.

Most CAD systems have a native data format that is particular to the respective CAD system. Moreover, most CAD systems are largely self-contained in that they only process data residing within the address space of the CAD system. These limitations deter interactive use of external application programs (EAPs) to perform operations relative to the CAD models and other activities on the CAD system.

SUMMARY OF THE INVENTION

The present invention addresses the limitations of conventional CAD systems by providing a modeling program/package that supports the exchange of data between an EAP and the modeling program/package. In one embodiment of the present invention, the modeling program/package is a CAD package that uses parametric feature-based models (which are defined below). An EAP registers with the CAD package to indicate that the EAP receives input data relative to a model in the CAD package and provides output data that is used within the same model or a different model in the CAD package. When there is a need for the EAP to be called, the callback is used to call the EAP as well as transfer data to the EAP and receive data from the EAP.

In accordance with one aspect of the present invention, a computer system runs a CAD package and an EAP. A model of an object is provided in the CAD package. The model includes input data to run the EAP and output data from the EAP. The model is modified, and it is determined that modifying the model changes the input data to the EAP, requiring recalculation of the output data from the EAP. Thus, new output data is obtained from the EAP. The EAP may, for example, perform an analysis, such as an engineering analysis, on a portion of the model.

In accordance with another aspect of the present invention, data is transferred into an EAP from a CAD program. The transferred data is used as the input required by a computation performed by the EAP. Subsequently, the model is modified so as to change the input data to the EAP. The data is automatically transferred by calling the external program without a user request.

In accordance with yet another aspect of the present invention, output data is imported into a CAD program from an EAP. The imported output data is integrated into the model. Subsequently, the model is modified so as to require updating of the output data. The output data is automatically updated by calling the EAP without a user request.

In accordance with yet another aspect of the present invention, a CAD system includes a CAD program and an EAP that is external to the CAD program. The CAD system also includes a model of an object that contains input data to and output data from the EAP. The CAD system further includes a registration facility for registering the EAP with the CAD program so that the CAD program calls the EAP when the data in the model to and from the EAP needs updating as a result of changes to the model.

BRIEF DESCRIPTION OF THE DRAWINGS

An illustrative embodiment of the present invention will be described below relative to the following drawings.

FIG. 9 illustrates an example of the modification of a model that references an EAP

DETAILED DESCRIPTION OF THE INVENTION

Figure 1:
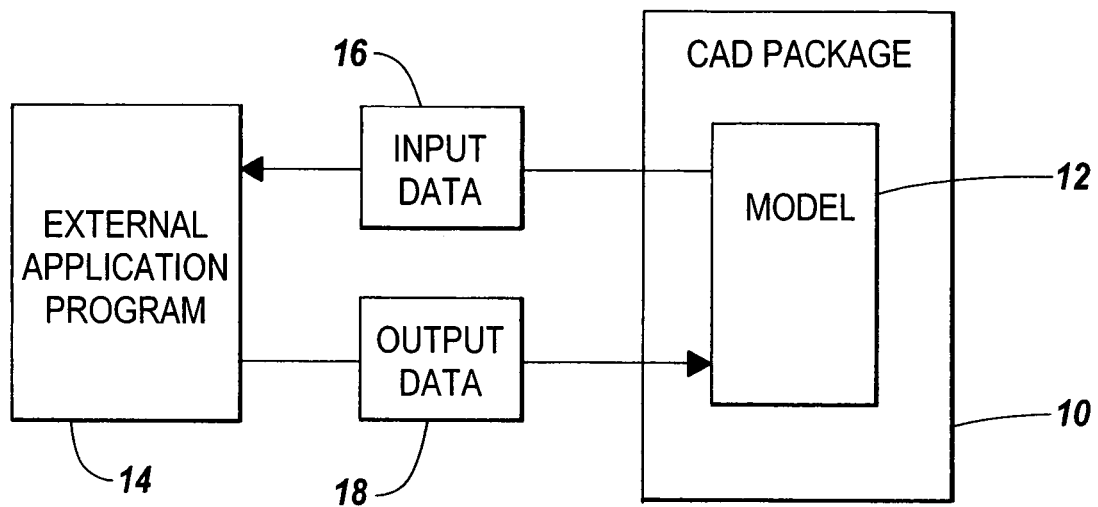
FIG. 1 depicts the exchange of data between an EAP and a CAD package.

The illustrative embodiment provides a CAD package that permits data exchange between the CAD package and one or more EAPs. Those skilled in the art will appreciate that the present invention is not limited to implementations where a CAD package is used, but more generally, the present invention may also employ other types of programs that model objects with models that contain geometric and/or numerical data. Hence, the present invention may also be practiced with computer-aided manufacturing (CAM) programs, CAD/CAM packages, industrial design programs and graphical modeling programs, for example. For purposes of the discussion below, it is presumed that the CAD package is the Pro/ENGINEER 2000i package from Parametric Technology Corporation of Waltham, Mass. The EAP and the CAD package exchange data parametrically.

The ability of the illustrative embodiment to integrate EAPs with the CAD package greatly expands the range of functionalities that are available to designers. Moreover, the illustrative embodiment permits designers to customize model definitions by employing custom EAPs. Since the data sent to and received from the EAP is integrated into the model, the data inside the model that is computed by the EAP is automatically updated when the model is updated, without the user making explicit commands to update the data computed by the EAP.

The CAD package of the illustrative embodiment uses "feature-based models," which represent a product as a combination of features. A "feature" is a generic shape or characteristic of a product that can be associated with certain attributes and knowledge that is useful for reasoning about the product. Features serve as the building blocks for product definition and for geometric reasoning. Features are modeling entities that allow geometric components of a product to be characterized and associated with a set of attributes that are relevant to an application.

The CAD package employs "parametric models." Parametric models represent models as sets of procedures having input parameters such as dimension values and output geometry. A parametric model stores a procedure for constructing the computer model of a product. In parametric models, the procedure for constructing the product may be viewed as a sequence of assignments to model variables as a function of input parameters for parametric equations. To create parametric variations, the construction procedure is reevaluated after changing the values of the input parameters (such as dimension values). This general definition of "parametric models" includes "variational models" or "variable-driven models" generated by some conventional CAD systems.

For purpose of the discussion below, it is helpful to define a few terms.

A "model" refers to a representation of an object, such as a commercial product or part.

A "geometric object" refers to an entity that has an associated geometry. It is presumed that all of the models described below model geometric objects.

A "part" refers to a component that can be separated from the whole of a product.

An "assembly" refers to a composition including multiple parts.

FIG. 1 depicts the basic interaction between an EAP 14 and a CAD package 10 in the illustrative embodiment of the present invention. In particular, the illustrative embodiment permits input data 16 to be sent from the model 12 to the EAP 14 and output data 18 resulting from the computation performed by the EAP 14 to be sent to the CAD package 10. The output data 18 is integrated into a model 12 in the CAD package 10. The output data 18 may take many different forms. For example, the output data may be the results of an engineering analysis. These results might be in the form of numerical parameters and/or geometric entities. Geometric entities include but are not limited to points, axes, planes, coordinate systems, curves, surfaces and solids. The model contains features that reference the parameters and/or geometric entities generated by the engineering analysis.

Figure 2:
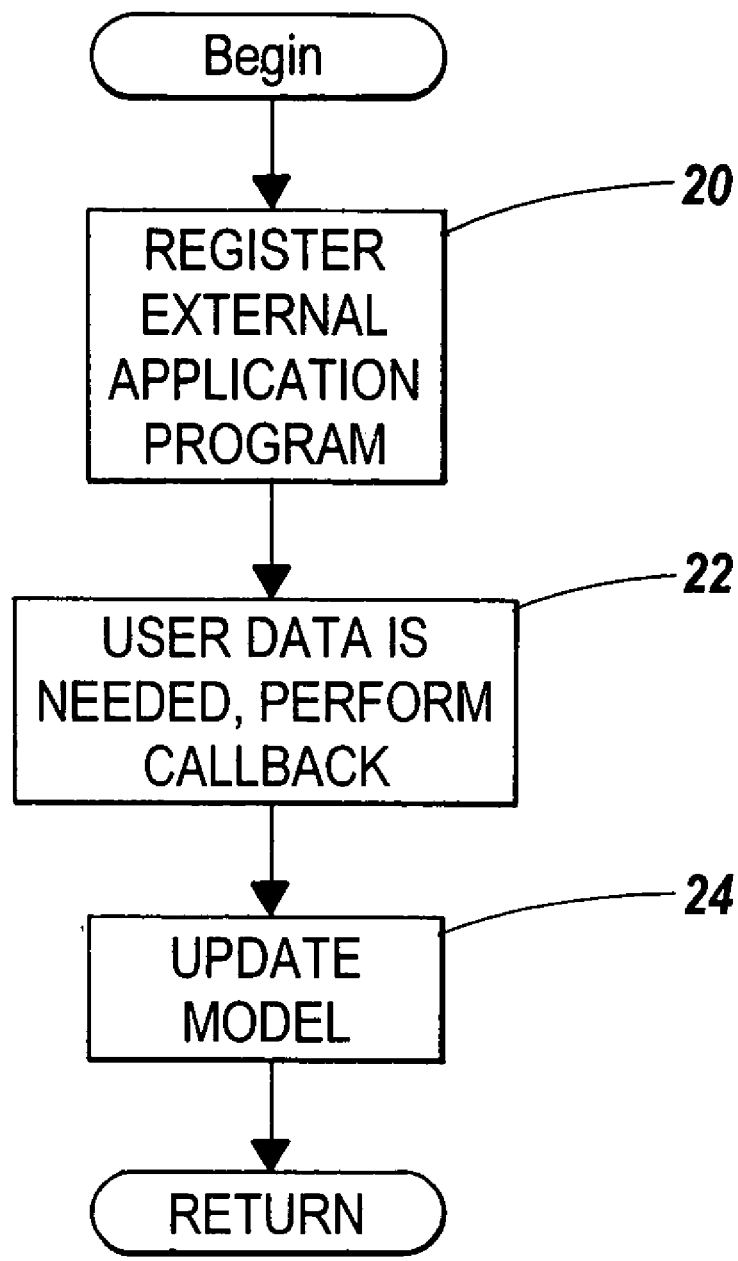
FIG. 2 is a flow chart illustrating the steps that are performed integrating a callback to an EAP and a model in the CAD package

FIG. 2 is a flow chart illustrating the steps that are performed in the illustrative embodiment for the EAP 14 to exchange data with the model 12. Initially, the EAP 14 registers with the CAD package 10 (step 20 in FIG. 2). Those skilled in the art will appreciate that the registration may take many forms. For example, the EAP 14 may provide information regarding its whereabouts and the appropriate protocol to use in calling the EAP. In the illustrative embodiment, the registration entails putting a callback in the CAD package 10 to call the EAP 14. This callback calls the EAP 14, sends the required input data 16, and obtains the output data 18.

Figure 3:
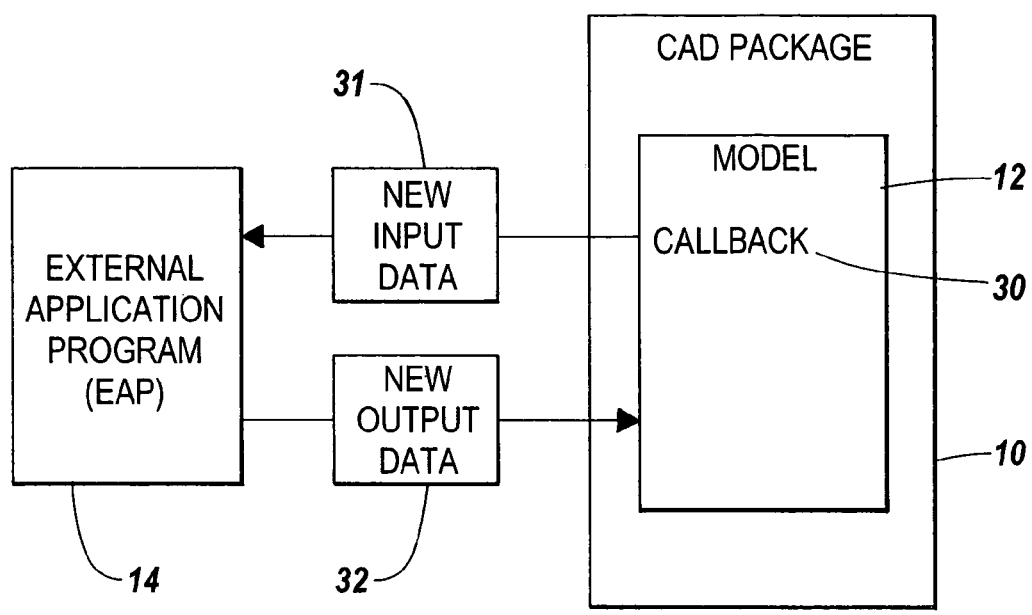
FIG. 3 is a block diagram illustrating a callback from the CAD package to the EAP to obtain new output data.

When input data is needed for the EAP 14, the callback for the EAP is called (step 22 in FIG. 2). The callback sends the input data 16 required by the EAP. The EAP 14 performs the necessary steps to process the input data 16 and forward the resulting output data 18 to update the model 12 (step 24 in FIG. 2). As can be seen in FIG. 3, the model 12 contains a callback 30 to the EAP 14. The callback 30 sends new input data 31 to the EAP 14. The EAP 14 generates new output data 32 that is sent to the model 12 and integrated therein.

Those skilled in the art will appreciate that the callback 30 need not call for the entire execution of the EAP 14 but may instead request that a particular function within the EAP be executed. In addition, the callback 30 need not call an application program per se but rather may also call other types of modules instead. Other mechanisms, such as remote procedure calls, may be used instead of callbacks in some embodiments.

Figure 4A:
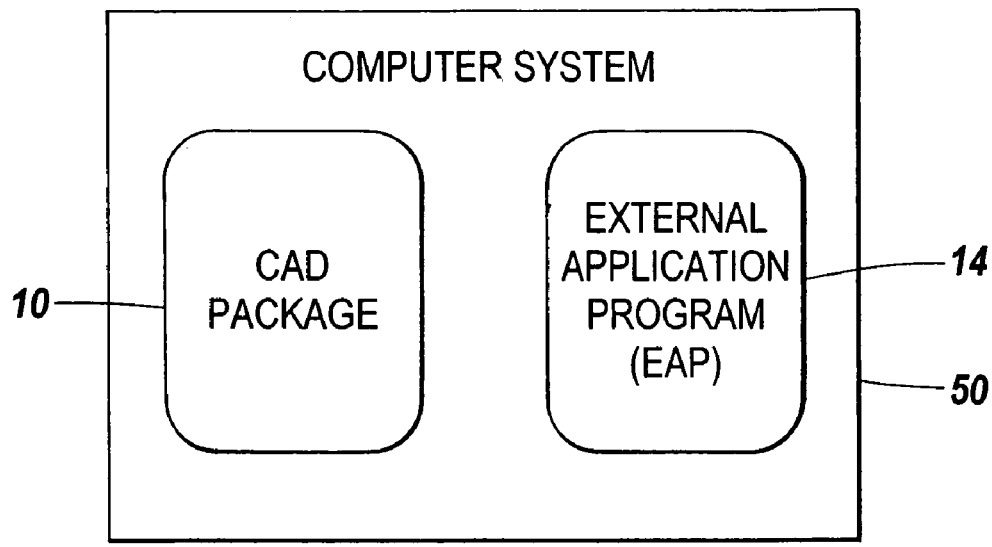
FIG. 4A shows an example where the CAD package and the EAP reside within a single computer system.
Figure 4B:
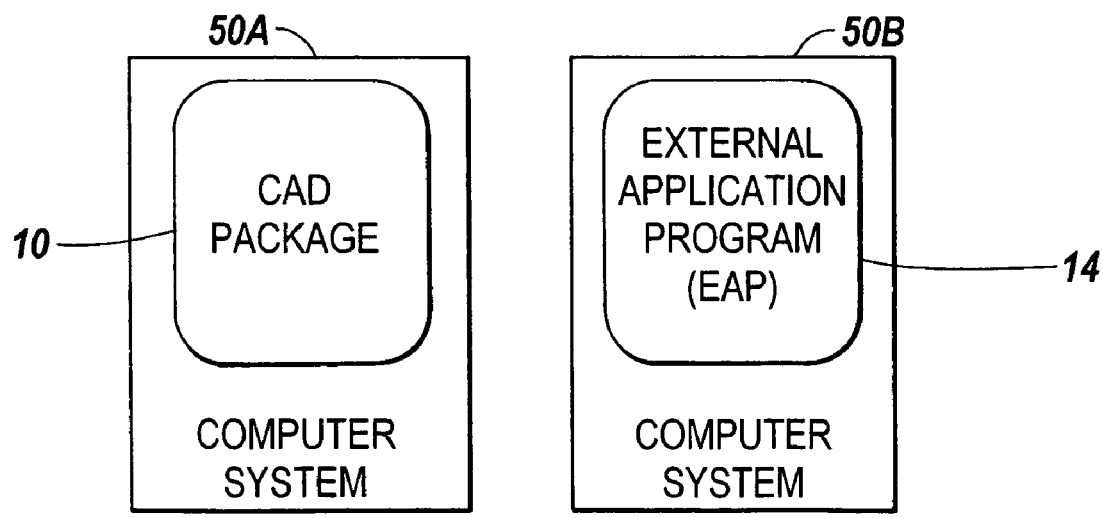
FIG. 4B illustrates an example wherein the CAD package and the EAP reside within separate computer systems.

FIG. 4A depicts a first possible implementation for the illustrative embodiment. In this implementation, a single computer system 50 contains CAD package 10 and an EAP 14. EAP 14 is "external" in that it is outside of CAD package 10 and does not execute within the address space allocated to the CAD package. FIG. 4B illustrates an alternative implementation in which the CAD package 10 resides on a first computer system 50A and the EAP 14 resides on a second computer system 50B. These computer systems 50A and 50B may be part of a computer network such as a local area network (LAN) or a wide area network (WAN). For purposes of the discussion below, it is presumed that the CAD package 10 and EAP 14 reside on a single computer system 50.

Figure 5:
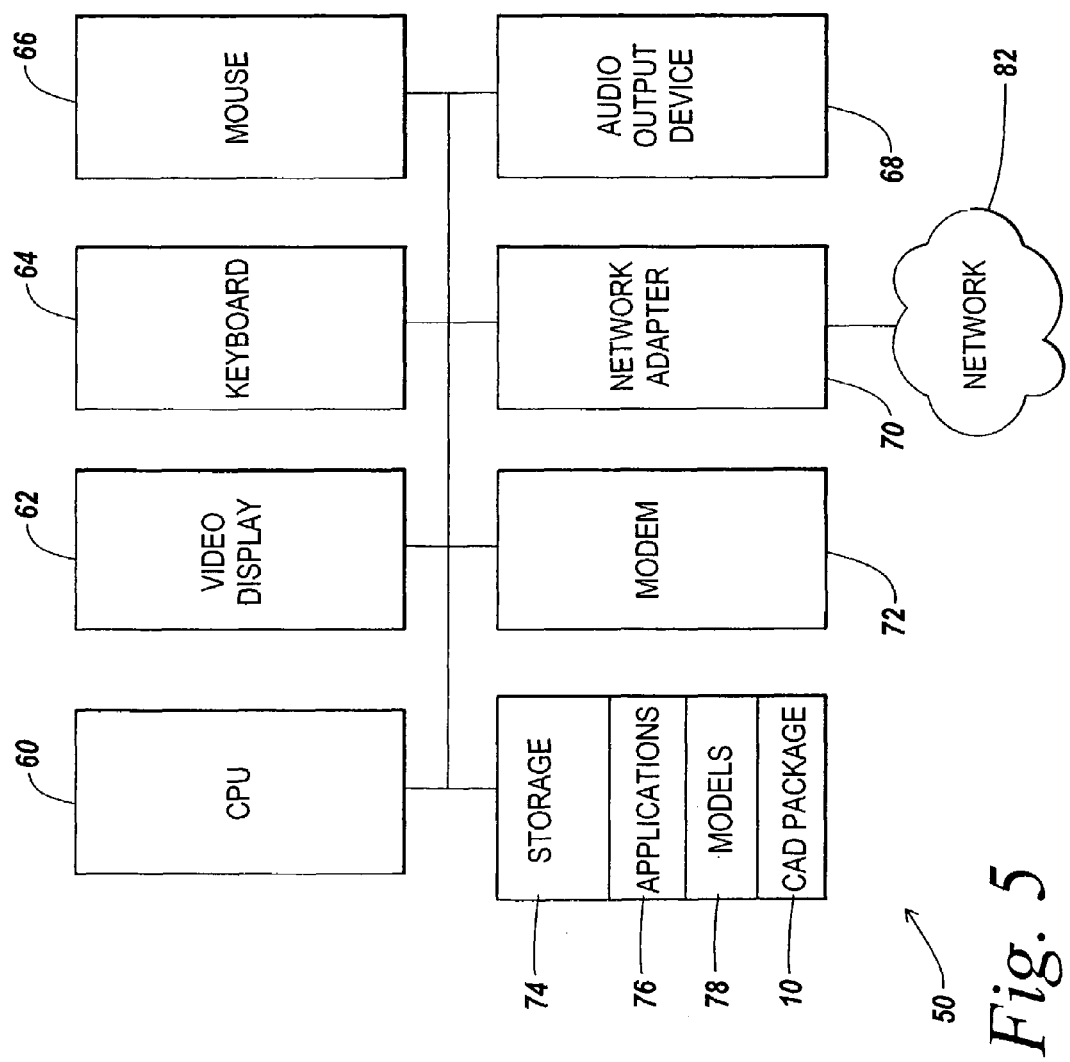
FIG. 5 illustrates an exemplary configuration for a computer system for practicing the illustrative embodiment.

FIG. 5 is a block diagram illustrating a suitable configuration for the computer system 50. The computer system 50 includes a central processing unit (CPU) that executes computer instructions. The computer system 50 includes a CPU 60, video display 62, keyboard 64, a mouse 66 and an audio output device 68. Those skilled in the art will appreciate that the computer system configuration shown in FIG. 5 is intended to be merely illustrative and not limiting of the present invention. The computer system 50 may include different peripheral devices from those shown in FIG. 5. Moreover, the computer system 50 may be implemented as a tightly coupled multiprocessor system or even as a distributed system. The computer system 50 may be implemented as a network computer, a personal computer, a mini-computer, a mainframe computer, a super computer, or any of a number of other different types of computer systems.

The computer system 50 includes a network adapter 70 for interfacing with the network 82. The computer system 50 also includes a modem 72 for communicating with remote computing resources over telephone lines, cable lines or wireless communication pathways. The computer system 50 includes a storage 74 that may include both primary memory and secondary memory. The storage 74 may include computer-readable media and removable media such as optical disks, magnetic disks and the like. The storage 74 holds one or more application programs 76. These application programs 76 include the EAP 14. The storage 74 may also hold one or more representations of models 78 for geometric objects. Lastly, the storage 74 may hold a copy of the CAD package 10.

Figure 6:
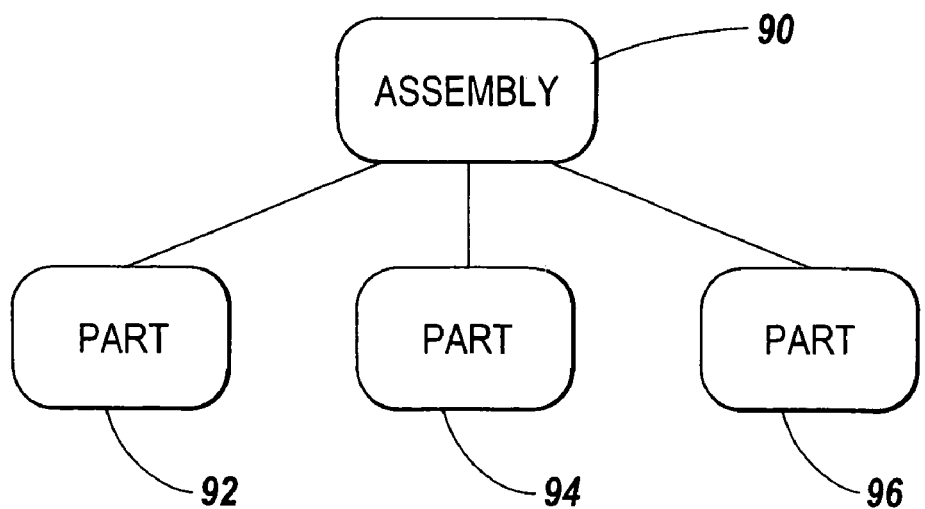
FIG. 6 illustrates an example of an assembly that is comprised of multiple parts.

The CAD package 10 represents geometric objects using models that are hierarchical in nature. A model may be an assembly that is comprised of multiple parts. FIG. 6 shows an example of an assembly 90 that is composed of parts 92, 94 and 96. Suppose, for example, a designer wishes to generate a model that represents an automobile engine. This automobile engine is an assembly that is comprised of many parts, for example, a four-cylinder engine may include four separate cylinder parts.

Figure 7:
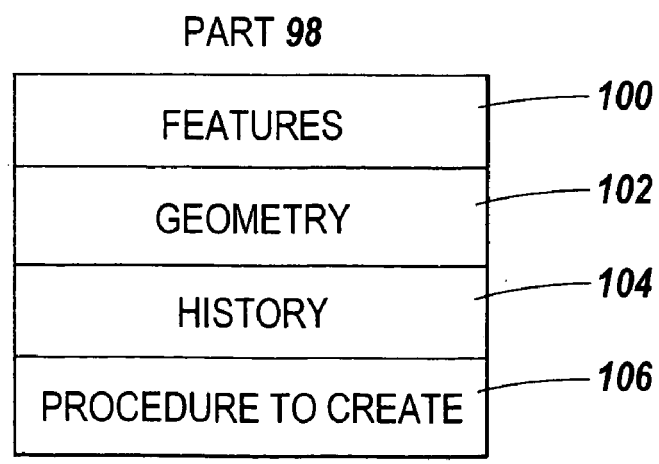
FIG. 7 illustrates components of a part database in the illustrative embodiment of the present invention.

Each part within a model contains a number of different types of information. FIG. 7 depicts the information that is maintained for a part database 98. The part database includes features 100 as well as a specification of geometry 102. The part database holds history information 104, which is maintained to identify history associated with the part. Lastly, the part database contains a procedure to create the part 106. The illustrative embodiment allows one or more features 100 to rely upon output data from the EAP 14. When the feature is being evaluated, the callback is used to call the EAP 14.

Figure 8:
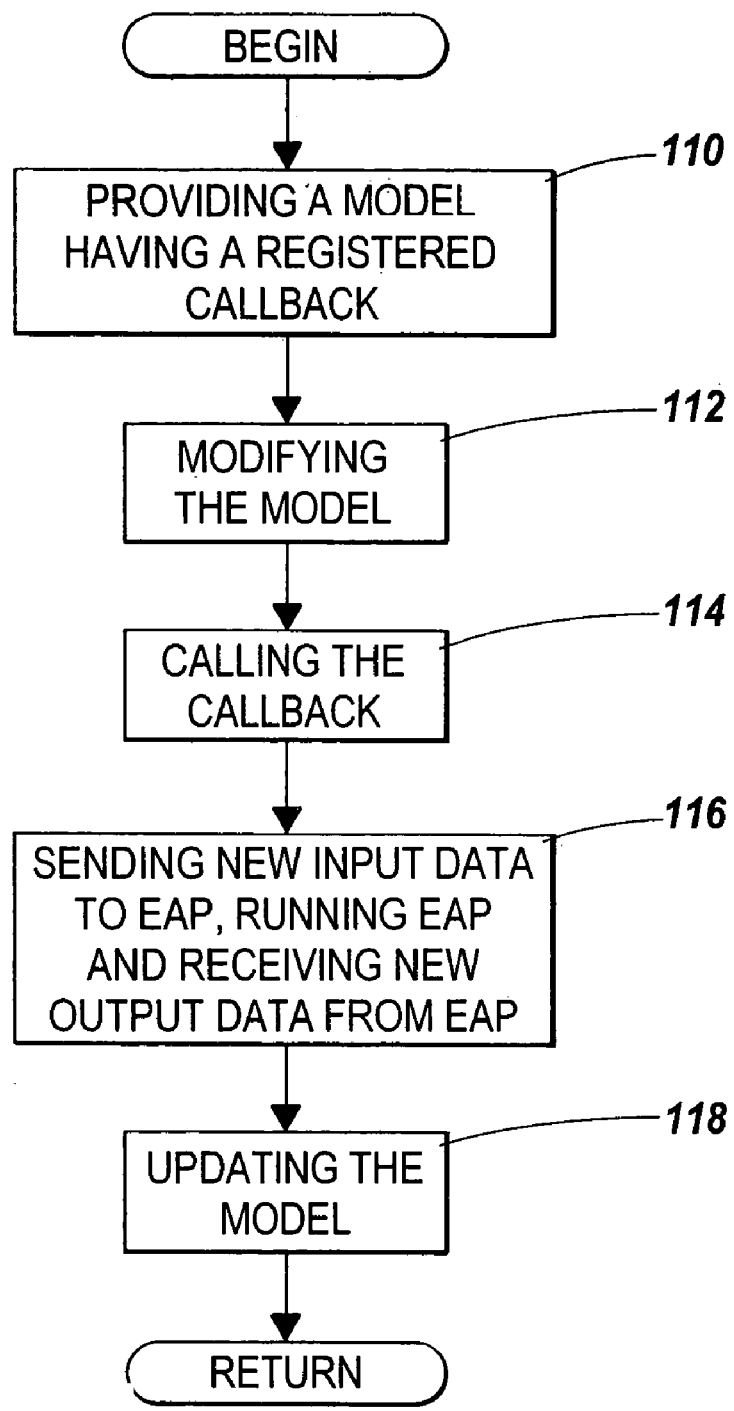
FIG. 8 is a flow chart illustrating the steps that are performed to modify a model that references an EAP.

FIG. 8 is a flow chart illustrating steps that are performed to update a model, where the model has registered a callback to an EAP. Initially, the model is provided (see step 110 in FIG. 8). The designer may request a modification to the model (step 112 in FIG. 8). Depending on the nature of the modification, the modification may require reevaluation of one or more features, and these features require the calling of the callback (step 114 in FIG. 8). The callback sends new input data 16 to the EAP 14, executes the EAP and receives new output data 18 from the EAP 14. The CAD package 10 receives the new output data (step 116 in FIG. 8) and updates the model 12 accordingly (step 118 in FIG. 8).

FIG. 9 illustrates an example in which the EAP 14 performs an analysis and a feature of a model is dependent on the results of the analysis. As shown in FIG. 9, the initial model (i.e. stage 130) contains a drill hole that is positioned at the center of gravity of the model. In stage 132, the model changes so as to have a different geometry, resulting in a change in the center of gravity. When the model is being reevaluated to accept change, it is determined that a callback is necessary for the EAP. Hence, in stage 134, the callback is executed and in stage 136, the EAP 14 calculates the new center of gravity. The new center of gravity is returned to the CAD package 10. The drill hole is then shifted to be positioned at the new center of gravity such that in stage 138, the model is fully updated.

While the present invention has been described with reference to an illustrative embodiment thereof, those skilled in the art will appreciate that various changes in form and detail may be made without departing from the intended scope of the present invention as defined in the appended claims.

What is claimed is:

1. In a computer system running a computer-aided design (CAD) package and an external application program (EAP), a method, comprising the steps of:
   providing a model of an object in the CAD package, wherein said model includes output data from the EAP integrated into said model, the EAP located in a separate address space from the CAD package;
   registering the EAP with the CAD package, the registration registering a callback to the EAP from the CAD package;
   modifying the model;
   determining programmatically without user input that the modifying of the model requires recalculation of the output data from the EAP; and
   in response to the determining, programmatically sending new input data to the EAP and obtaining new output data from the EAP.

2. The method of claim 1 wherein the method further comprises the step of calling the EAP from the CAD package to obtain the new output data.

3. The method of claim 1 wherein the EAP performs analysis on at least a portion of the model to produce the original output data and the new output data.

4. The method of claim 3 wherein the analysis is an engineering analysis.

5. The method of claim 1 wherein the method further comprises the steps of:
   further modifying the model;
   determining that the further modifying of the model requires further recalculation of the output data from the EAP; and
   in response to the determining that the further modifying of the model requires further recalculation of the output data, obtaining new output data from the EAP.

6. In a computer system having a computer-aided design (CAD) program for manipulating a model of an object, a method, comprising the steps of:
   registering an external application program (EAP) with a CAD program, the registration registering a callback that is called from the CAD program to access the EAP;
   exporting data from a CAD model in the CAD program to an EAP, the EAP located in a separate address space from the CAD program;
   using the exported data as input data to execute the EAP and obtain output data from the EAP;
   importing the output data into the CAD program from the EAP;
   integrating the output data into the CAD model such that future changes to the model require additional calculations to be performed by the EAP;
   modifying the CAD model;
   determining programmatically without user input that the modifications to the model require new output data from the EAP;
   in response to the determination that the modifications to the model require new output data from the EAP, programmatically calling the EAP without user input and passing new input data to the EAP, the new input data generated from the modification of the model, the new input data used by the EAP to generate updated output data; and
   automatically integrating the updated output data into the CAD model without a user request.

7. The method of claim 6 wherein the CAD model is a feature-based model.

8. The method of claim 6 wherein the CAD model is a parametric model.

9. The method of claim 6 wherein at least one of said integrating the output data into the CAD model and said automatically integrating the updated output data into the CAD model comprises adding parameters to the CAD model.

10. The method of claim 6 wherein at least one of said integrating the output data into the CAD model and said automatically integrating the updated output data into the CAD model comprises adding geometric entities to the CAD model.

11. A computer-aided design (CAD) system, comprising:
   a CAD program;
   an external application program (EAP) that is located in a separate address space from the CAD program;
   a model of an object that contains output data from the EAP integrated into the model such that future changes to the model are programmatically determined without user input to require additional calculations to be performed by the EAP; and
   a registration facility for registering a callback for the EAP with the CAD program so that the CAD program calls the EAP when the output data from the EAP in the model needs updating as a result of changes to the model.

12. The CAD system of claim 11 wherein the model is a feature-based model.

13. The CAD system of claim 11 wherein the model is a parametric model.

14. In a computer system running an external application program (EAP) and a computer-aided design (CAD) package with a model of an object that includes output data from the EAP, a computer-readable medium holding computer-executable instructions for performing a method, comprising the computer-implemented steps of:
   registering the EAP with the CAD package, the registration registering a callback to the EAP from the CAD package;
   modifying the model;
   determining programmatically without user input that the modifying of the model requires recalculation of the output data from the EAP, the EAP located in a separate address space from the CAD package; and in response to the determining, sending new input data to the EAP and obtaining new output data from the EAP.

15. The computer-readable medium of claim 14 wherein the method further comprises the step of calling the EAP from the CAD package to obtain the new output data.

16. The computer-readable medium of claim 14 wherein the EAP performs analysis on at least a portion of the model to produce the output data and the new output data.

17. In a computer system having a computer-aided design (CAD) package program for manipulating a model of an object, a computer-readable medium holding computer-executable instructions for performing a method, comprising the computer-implemented steps of:
   registering an external application program (EAP) with a CAD program, the registration registering a callback that is called from the CAD program to access the EAP;
   importing output data into the CAD program from an external application program (EAP), the EAP located in a separate address space from the CAD program;
   integrating the output data into the model such that future changes to the model require additional calculations to be performed by the EAP;
   modifying the model;
   determining programmatically without user input that the modifying of the model requires recalculation of the output data from the EAP; and
   automatically updating the output data by calling the EAP with new input data without a user request.

18. The computer-readable medium of claim 17 wherein the model is feature-based.

19. The computer-readable medium of claim 17 wherein the model is parametric.

* * * * *